US008080858B2

(12) United States Patent
Hirler et al.

(10) Patent No.: US 8,080,858 B2
(45) Date of Patent: Dec. 20, 2011

(54) SEMICONDUCTOR COMPONENT HAVING A SPACE SAVING EDGE STRUCTURE

(75) Inventors: Franz Hirler, Isen (DE); Ralf Siemieniec, Villach (AT); Christian Geissler, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 151 days.

(21) Appl. No.: 11/833,328

(22) Filed: Aug. 3, 2007

(65) Prior Publication Data

US 2008/0042172 A1    Feb. 21, 2008

(30) Foreign Application Priority Data

Aug. 3, 2006   (DE) .......................... 10 2006 036 347

(51) Int. Cl.
*H01L 29/02*    (2006.01)
*H01L 29/66*    (2006.01)
*H01L 29/06*    (2006.01)
*H01L 23/58*    (2006.01)

(52) U.S. Cl. ........ 257/487; 257/329; 257/330; 257/331; 257/332; 257/340; 257/341; 257/488; 257/489; 257/490; 257/491; 257/492; 257/493; 257/494; 257/495; 257/496

(58) Field of Classification Search ................. None
See application file for complete search history.

(56) References Cited

U.S. PATENT DOCUMENTS

| | | | |
|---|---|---|---|
| 4,941,026 A | 7/1990 | Temple | |
| 5,166,912 A | 11/1992 | Kanesaka | |
| 5,763,915 A | 6/1998 | Hshieh et al. | |
| 6,534,830 B2 * | 3/2003 | Tihanyi et al. | ................. 257/343 |
| 2003/0178676 A1 * | 9/2003 | Henninger et al. | ........... 257/340 |
| 2006/0006386 A1 * | 1/2006 | Hirler et al. | ..................... 257/60 |
| 2006/0118864 A1 * | 6/2006 | Hirler et al. | ................... 257/335 |
| 2006/0289928 A1 * | 12/2006 | Takaya et al. | ................. 257/330 |

FOREIGN PATENT DOCUMENTS

| | | |
|---|---|---|
| DE | 103 12 911 | 10/2004 |
| DE | 103 53 387 | 6/2005 |
| DE | 10 2004 052 678 | 6/2006 |
| JP | 07142713 | 6/1995 |
| WO | 0038242 | 6/2000 |
| WO | 2004107448 | 12/2004 |
| WO | 2006046388 | 5/2006 |

* cited by examiner

*Primary Examiner* — N Drew Richards
*Assistant Examiner* — Michael Jung
(74) *Attorney, Agent, or Firm* — Dicke, Billig & Czaja, PLLC (57) ABSTRACT

A Semiconductor component having a space saving edge structure is disclosed. One embodiment provides a first side, a second side, an inner region, an edge region adjoining the inner region in a lateral direction of the semiconductor body, and a first semiconductor layer extending across the inner region and the edge region and having a basic doping of a first conductivity type. At least one active component zone of a second conductivity type, which is complementary to the first conductivity type, is disposed in the inner region in the first semiconductor layer. An edge structure is disposed in the edge region and includes at least one trench extending from the first side into the semiconductor body. An edge electrode is disposed in the trench, a dielectric layer is disposed in the trench between the edge electrode and the semiconductor body, a first edge zone of the second conductivity type adjoin the trench and are at least partially disposed below the trench.

11 Claims, 7 Drawing Sheets

SEMICONDUCTOR COMPONENT HAVING A SPACE SAVING EDGE STRUCTURE

CROSS-REFERENCE TO RELATED APPLICATIONS

This Utility Patent Application claims priority to German Patent Application No. DE 10 2006 036 347.7-33 filed on Aug. 3, 2007, which is incorporated herein by reference.

BACKGROUND

The present invention relates to a semiconductor component, in particular a power transistor, including a semiconductor body having a pn-junction in an inner region of the semiconductor body and an edge structure in an edge region of the semiconductor body.

A component structure with a semiconductor junction, i.e. a pn-junction, exists both in bipolar components, like diodes, bipolar transistors and IGBTs, and in unipolar components, like MOSFETs. These components differ in terms of their behaviour in conducting state. However, common to these components is that in blocking state starting from the semiconductor junction a space charge zone expands with increasing blocking voltage.

In vertical components the pn-junction is basically parallel to one of the sides of a semiconductor body. Without taking additional measures the voltage proof (maximum blocking voltage) is reduced in those areas which adjoin the pn-junction an a lateral direction. Usually this is the edge region of the semiconductor body, i.e. the region being adjacent to a side surface or edge surface, of the semiconductor body, with the edge surface running in a vertical direction between a front side and a back side of the semiconductor body. The region with the pn-junction usually forms the inner region, which is usually larger in terms of its area size than the edge region.

To increase the voltage proof in the edge region, and to therefore concentrate an avalanche breakdown in the larger inner region upon reaching a maximum blocking voltage, different edge terminations or edge structures are known. These edge terminations serve to reduce the curvature of electric field lines in the edge region when applying a blocking voltage to the component, and therefore serve to reduce the field strength in the edge region as compared to the field strength in the inner region.

SUMMARY

A semiconductor component according to one example includes a semiconductor body including a first side, a second side, an inner region, an edge region adjoining the inner region in a lateral direction of the semiconductor body, and a first semiconductor layer extending across the inner region and the edge region and having a basic doping of a first conductivity type; at least one active component zone of a second conductivity type, which is complementary to the first conductivity type, being disposed in the inner region in the first semiconductor layer; and an edge structure disposed in the edge region. The edge structure includes at least one trench extending from the first side into the semiconductor body, an edge electrode disposed in the trench, a dielectric layer disposed in the trench between the edge electrode and the semiconductor body, a first edge zone of the second conductivity type adjoining the trench and being at least partially disposed below the trench.

A semiconductor component according to a further example includes a semiconductor body including a first side, a second side, an inner region, an edge region adjoining the inner region in a lateral direction of the semiconductor body, and a first semiconductor layer extending across the inner region and the edge region and having a basic doping of a first conductivity type; at least one active component zone of a second conductivity type, which is complementary to the first conductivity type, and being disposed in the inner region in the first semiconductor layer; and an edge structure disposed in the edge region. The edge structure includes at least one trench extending from the first side into the semiconductor body, a dielectric layer filling the trench, and a first edge zone of the second conductivity type adjoining the at least one trench, being disposed at least partially below the trench, and having a doping which is selected such that it may be depleted completely or except for a region having dimensions smaller than a lateral width of the edge trench, when applying a blocking voltage to a semiconductor junction formed between the active component zone and a zone of the semiconductor layer having the basic doping.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
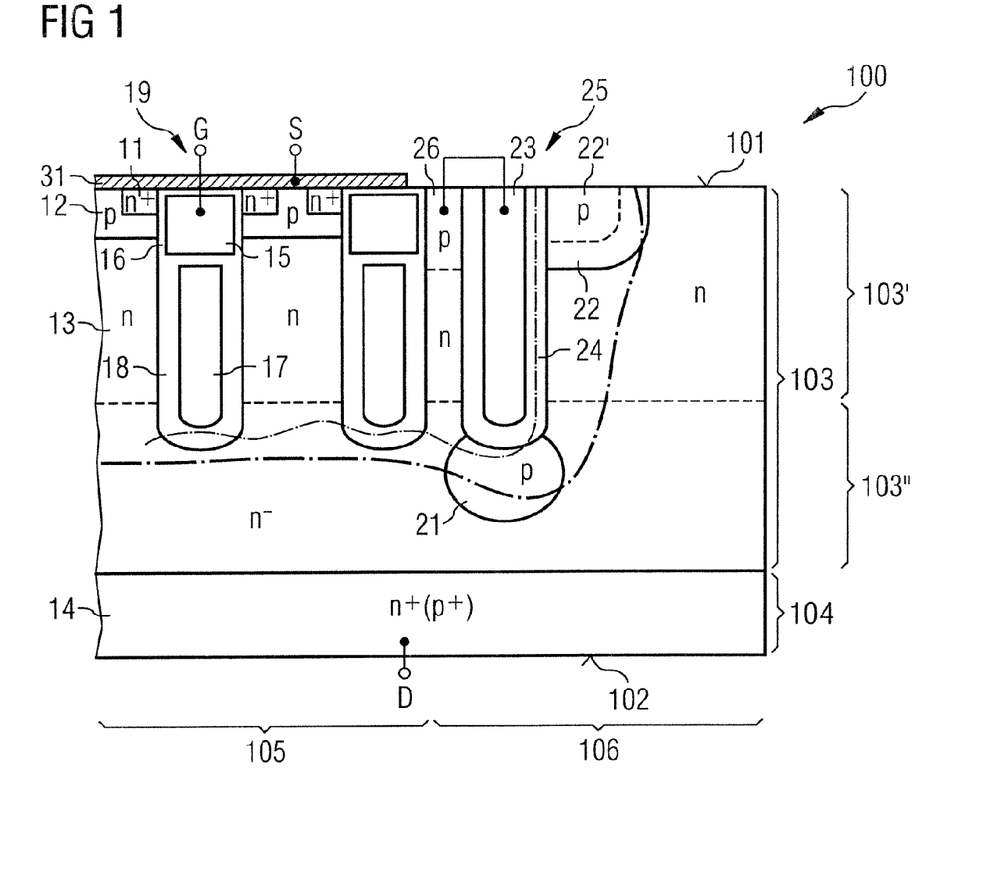
FIG. 1 illustrates a semiconductor component realized as a MOS transistor, with the component including an edge structure having a trench and an edge electrode disposed in the trench.

FIG. 1 illustrates a cross sectional view of a section of a semiconductor component according to one embodiment. The semiconductor component includes a semiconductor body 100 having a first side 101, being denoted as front side in the following, and a second side 102, being denoted as back side in the following. The back side 102 is disposed opposed to the first side 101 in a vertical direction of the semiconductor body 100. The semiconductor body 100 includes a first semiconductor layer 103 having a basic doping of a first conductivity type, in the example a basic n-doping. First semiconductor layer 103, which adjoins the front side 101 of the semiconductor body 100, is, for example, an epitaxial layer 103 that is disposed on a second semiconductor layer 104, with the second semiconductor layer 104, for example, being a semiconductor substrate. It should be noted that dimensions of the first and second semiconductor layers 103, 104 of FIG. 1 in vertical direction are not to scale. Usually, when realizing the first semiconductor layer 103 as an epitaxial layer on a substrate 104, the dimensions of the epitaxial layer 103 in vertical direction of semiconductor body 103 are significantly smaller than the dimensions of the semiconductor substrate 104.

Semiconductor body 100 includes an inner region 105 and an edge region 106 adjoining the inner region 105 in a lateral direction of semiconductor body 100. Disposed in the first semiconductor layer 103 and in the inner region 105 of semiconductor body 100 is an active component zone 12 of a second conductivity type, which is a p-doped zone according to the example. Active zone 12 together with an adjoining region of semiconductor layer 103 that has the n-basic doping forms a pn-junction. In the example of FIG. 1 active component zone 12 is part of a transistor structure of a trench MOS transistor, being realized in inner region 105 of the semiconductor body p-doped active component zone 12 forms a body zone of the transistor, which, in a vertical direction of the semiconductor body 100, is disposed between a source zone 11 and a drift zone 13. Source zone 11 and drift zone 13 are doped complementary to the body zone 12. A section of the semiconductor layer 103 that has the basic doping and that extends from body zone 12 to semiconductor substrate 104 in a vertical direction forms the drift zone 13 in this component. The semiconductor substrate 104 forms a drain zone 14 of the MOS transistor.

For controlling an inversion channel in body zone 12 between source zone 11 and drift zone 13 the component includes a gate electrode 15. The gate electrode 15 is disposed in a trench 19 that extends from the first side 101 in a vertical direction into semiconductor body 100. According to the example in FIG. 1, gate electrode 15 is disposed adjacent to body zone 12 in lateral direction of the semiconductor body 100, and is dielectrically insulated against body zone 12 using a gate dielectric 16. In vertical direction of the semiconductor body 100 gate electrode 15 extends from source zone 11 to drift zone 13.

In the inner region 105 of semiconductor body 100 a number of identical transistor structures, each having a gate electrode 15, a source zone 11 and a body zone 12, may be formed. These identical transistor structures will be denoted as transistor cells in the following. These transistor cells are connected in parallel by electrically connecting their source zones 11 with each other. In the component according to FIG. 1 this is achieved by using source electrode 31 which is disposed above the front side of semiconductor body 100 and which contacts the source zones 11 of the individual transistor cells. Further, source electrode 31 short-circuits source zones 11 and body zones 12 of the transistor cells in known manner. Drift zone 13 as well as drain zone 14 are common to all transistor cells in this component. The transistor cells connected in parallel form a cell array.

In the same trenches 19 as the gate electrodes 15 field electrodes 17 may be disposed, which, in a vertical direction, are disposed below the gate electrodes 15, and, in a lateral direction, are disposed adjacent to sections of drift zone 13. These field electrodes 17 in the trenches are insulated against the first semiconductor layer 103 by field electrode dielectric 18, with the field electrode dielectric being thicker as compared to the gate dielectric 16. In a manner not illustrated in detail field electrodes 17 may be connected to source zones 11, or the source electrode 31, respectively, with the field electrodes 17 thereby having a source potential of the component. Field electrodes 17, in a known manner, serve to compensate a part of the doping charge present in drift zone 13 when the component is blocking (turned off), thereby increasing the voltage proof of the component. The doping charge results from doping the drift zone with dopants.

The transistor structure of FIG. 1 blocks, when there is no drive potential present at the gate electrode 15 suitable for effecting an inversion channel in the body zone 12, and when a voltage is present between a drain terminal D (connected to drain zone 14) and the source terminals that blocks the pn-junction between body zone 12 and drift zone 13. The blocking voltage for the n-MOSFET of FIG. 1 is a positive voltage between drain D and source S. For a p-MOSFET, in which the individual component zones are doped complementary to the component zones of the component of FIG. 1, this voltage is a negative voltage between drain and source.

When a blocking voltage is applied to the component a space charge zone starting from the pn-junction extends in inner region 105 in vertical direction of the semiconductor body 100. The space charge zone extends further with increasing blocking voltage until a maximum voltage proof of the component is reached and avalanche breakthrough sets in. In the edge region 106 the component includes an edge structure. Edge structure serves to obtain a voltage proof in the edge region being at least the voltage proof of the component in the inner region 105. It should be noted in this connection that "edge region" not necessarily is a region of the semiconductor body 100 which is close to a lateral edge of the semiconductor body 100. "Edge region" in connection with the present invention is a region of the semiconductor body which adjoins a semiconductor region in a lateral direction, with the semiconductor region including active component areas of a vertical power semiconductor component. Besides a power MOSFET as illustrated in FIG. 1 such vertical power semiconductor component may be a power IGBT or a power diode which will be explained with reference to FIG. 2 herein below. Starting from the component according to FIG. 1 a power IGBT is obtained by doping the drain zone complementary to the drift zone 13.

In the component according to FIG. 1 the edge structure includes a further trench 25, which starting from the front side 101 extends in vertical direction into the semiconductor body. An electrode, which will be referred to as edge electrode in the following, is disposed in this trench 25 and is dielectrically insulated against the first semiconductor layer 103 by a dielectric layer.

The edge structure further includes a first edge zone 21, with the edge zone 21 being doped complementary to the basic doping of semiconductor layer 103, directly adjoining edge trench 25, and being at least partially disposed below edge trench 25 in the vertical direction. The edge structure further includes an optional second edge zone 22, with the second edge zone 22 directly adjoining the edge trench in the lateral direction of the semiconductor body 100, and adjoining the front side 101 in the vertical direction. The second edge zone 22 is doped complementary to the basic doping of the first semiconductor layer 103, and, in the example, adjoins the trench in a direction opposite to the direction of the cell array.

The embodiment may further include an edge zone 26 between the edge trench 25 and the outermost trench of the transistor cell array, with the outermost trench being the trench disposed closest to the edge region 106. The further edge zone 26 is doped complementary to the basic doping of first semiconductor layer 103. The edge zone 26 reaches from edge trench 25 to the outermost "transistor trench" lying of the transistor cell array, with the transistor trench having gate electrode 16 and field electrode 17 disposed therein. In this component edge electrode 23 is connected to further edge zone 26 between edge trench 25 and the cell array.

Alternatively to connecting edge electrode 23 to the further edge zone 26, edge electrode 23 may be connected to source electrode 31 (not illustrated).

Semiconductor layer 103, that, in the inner region of the semiconductor body, forms the drift zone 13 of the MOS transistor, may include two differently doped partial layers: a first partial layer 103', adjoining active component zone 12; and a second partial layer 103", adjoining first partial layer 103' and being lower doped than first partial layer 103'. Such sub-division of semiconductor layer 103 in two partial layers 103', 103" is depicted in dashed lines in FIG. 1. Lower doped partial layer 103" is basically disposed below the trench structure of the cell array and the edge structure, where trenches 19, 25 may extend into lower doped partial layer 103". First edge zone 21 may completely disposed in lower doped partial layer 103".

By sub-dividing semiconductor layer 103 in a lower doped second partial layer 103" and a higher doped first partial layer 103' the semiconductor component includes a higher doped drift zone section in the region of field electrodes 17, and a lower doped drift zone section. The lower doped drift zone section increases the voltage proof of the component and is not depleted/compensated by field electrodes 17 in a lateral direction.

For comparison reasons lets assume that a reference component exists that has a drift zone which is completely doped as high as the first partial layer 103' of the component according to FIG. 1, and that has no field electrode. The doping concentration of the higher doped partial layer 103' of the present component as compared to the doping concentration of lower doped partial layer 103' is selected such that the voltage proof of the reference component is less than 50% of the voltage proof of the present component. In other words: the voltage proof of the present component is more than two times the voltage proof of the reference component.

When the component blocks the edge structure serves to influence the course of field lines in the semiconductor body. In FIG. 1 two equipotential lines of the electric field are depicted in dash-dot lines. These equipotential lines run in a lateral direction in the inner region 105 and in the edge region 106 bent into the direction of the front side 101, without a higher electric field occurring in the edge region 106 as compared to inner region 105. To increase the voltage proof in the edge region 106 as compared to the voltage proof in the inner region 105 a mutual distance between equipotential lines in the edge region is increased by the edge structure according to FIG. 1. The dielectric layer 24 surrounding field electrode 23 serves to absorb a bigger part of the blocking voltage in the edge region and bents the equipotential lines in the direction of the front side. However,—without taking further measures—bending the equipotential lines would result in an increase of the electric field strength in the semiconductor material, silicon for example, below the trenches 25. First edge region 21 adjoining the trench serves to avoid such increase in the electrical field strength and reduces the electric field in the semiconductor material below the trenches when the component blocks state. In this connection the doping concentration of the first edge zone 21 is selected such, that it may be completely depleted, or that it may be depleted except for a region having dimensions smaller than the width of trench 25 in lateral direction. It should be noted, that the dimensions of first edge zone 21 in lateral direction of the semiconductor body 100 are usually—but not necessarily— larger than the dimensions of the trench 25 in this direction.

Second edge zone 23 serves to "shift" the equipotential lines from edge trench further in the direction of the edge to avoid an increase in the electric field below the trenches due to bending the equipotential lines in this region. The doping concentration of second edge zone 22 may be selected such, that it may not be depleted completely. In the latter case only in parts of the second edge zone 22 an electric field is present, when the component blocks, while in parts of second edge zone 22 no electric field is present. This is equivalent to the fact that a doping charge present in the second edge zone 22 is higher than a breakthrough charge of the used semiconductor material.

In the example second edge zone 22 of edge structure starting from front side 101 extends deeper into semiconductor body 100 in the vertical direction as compared to the active component zones forming the pn-junction (body zone 12 and inner region 105).

In a direction vertical to the drawing plain of FIG. 1 trenches may be elongated, where the further component zones of the transistor structure may run elongated in this direction, either. Edge structure is ring-shaped and surrounds the transistor structure of the inner region 105 in a manner not illustrated in detail.

Figure 2:
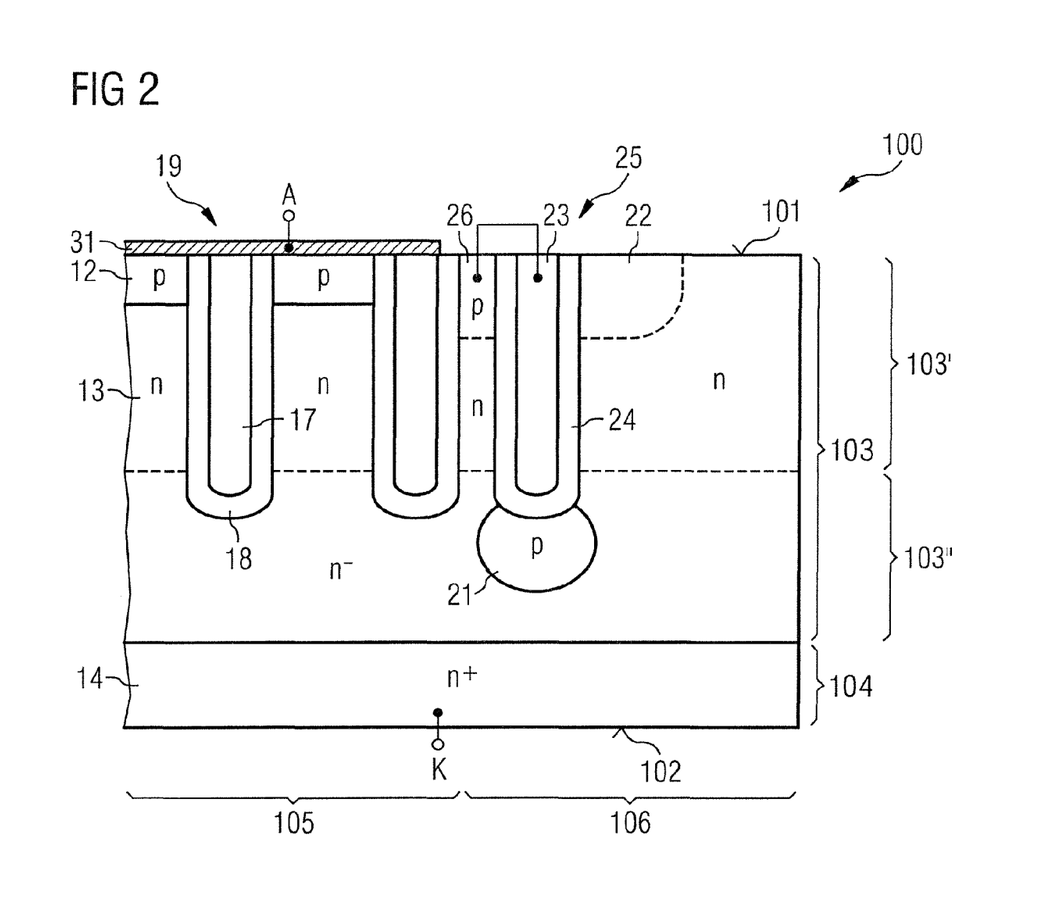
FIG. 2 illustrates a semiconductor component formed as a diode, with the semiconductor component including an edge structure having a trench and an edge electrode disposed in the trench.

FIG. 2 illustrates a semiconductor component realized as a diode. An edge structure disposed in an edge region 106 of semiconductor body 100 corresponds to the edge region of the power transistor according to FIG. 1. Inner area 105 in the component according to FIG. 2 includes a diode structure having a p-doped active component zone 12, a first n-doped semiconductor zone 13 adjoining p-doped zone 12, and a second n-doped semiconductor zone 14 adjoining first n-doped semiconductor zone 13. First n-doped zone 13 is formed by sections of semiconductor layer 103 having the basic n-doping. Second n-doped semiconductor zone 14 is doped higher than n-zone 13 and is formed by semiconductor substrate 104. Between the p-zone 12 forming a p-emitter of the transistor structure and the first n-zone 13 forming a n-basis of the transistor structure a pn-junction is present. Second n-zone 14 forms the n-emitter of the diode. The diode structure further includes trenches, which starting from the front side 101 extend into the semiconductor body. In the trenches field electrodes 17 are disposed adjacent to the n-basis 13, where the field electrodes 17 are insulated against the n-basis 13 using a field electrode dielectric 18. Field electrodes 17, for example, may be connected to an anode electrode 31, which is disposed above front side 101 and which contacts p-emitter zones 12 (anode zones) of the diode structure n-emitter 14 is connected to a cathode electrode K, which is schematically illustrated.

The p-emitter 12 of the diode according to FIG. 2 may be replaced by a Schottky-metal-zone (not illustrated), to obtain a Schottky diode instead of the bipolar diode.

Figure 3:
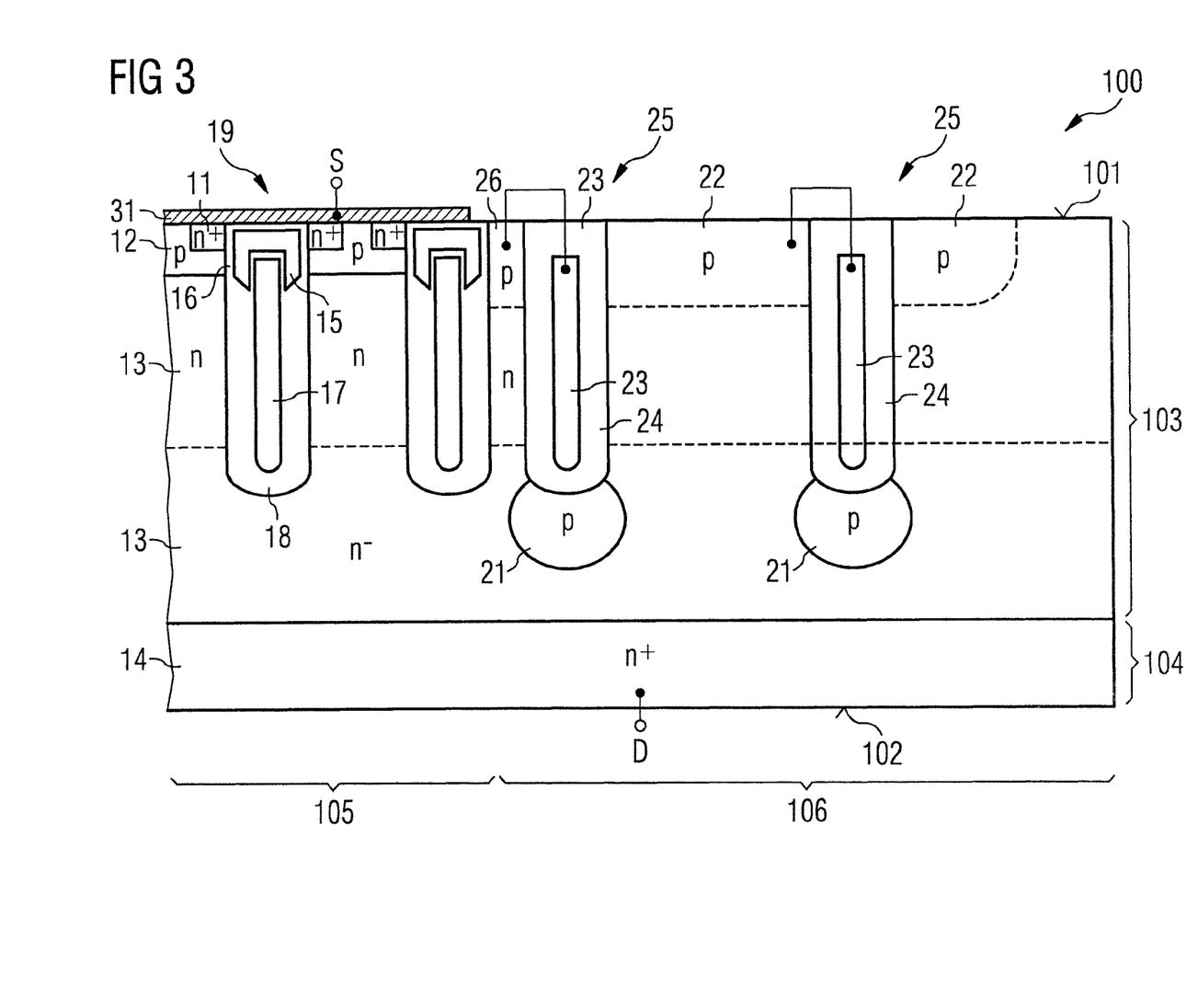
FIG. 3 illustrates a semiconductor component realized as a MOS transistor, with the component having an edge structure with several trenches and edge electrodes disposed in the trenches.

FIG. 3 illustrates a semiconductor component which is modified as compared to the semiconductor component of FIG. 1 and which is rated for higher blocking voltages. The component includes an edge structure having several—two, according to the example—edge trenches 25. Associated with each edge trench is a first edge zone 21, with each of these edge zones 21 being doped complementary to the basic doping of semiconductor layer 103, and being disposed at least partially below the trenches 25. Further, optional second edge zones 22 are associated with each of these trenches 25, with each of these second edge zones 22 being doped complementary to the basic doping of semiconductor layer 103, adjoining the trenches 25 in a lateral direction, and directly adjoining the front side of the semiconductor body. The second edge zone 22—corresponding to the second edge zone 22 of the component according to FIG. 1—of the outermost trench 25 in this edge structure adjoins the trench 25 in a direction which is opposite to the direction of the inner region 105. Second edge zones 22 associated with the further trenches—only one further trench in FIG. 1—extend in lateral direction between adjacent edge trenches.

The embodiment as illustrated further includes a further edge zone 26 which is disposed between an edge trench 25 closest to the cell array and the outermost transistor trench of the cell array. Edge electrode 23 of the edge trench 25 being disposed closest to the cell array is connected to further edge zone 26. Edge electrode 23 of edge trench 25 which is disposed distant to the cell array is connected to a second edge zone 22 which, in the direction of the cell array, is disposed between this edge trench and an adjacent edge trench. For further increasing the voltage proof further edge trenches with edge electrodes may be provided (not illustrated). Each of these edge electrodes are connected to a semiconductor zone, being disposed adjacent to the trenches in the direction of the cell array, and being doped complementary to the basic doping of the semiconductor layer 103. Referring to the example of FIG. 3 these semiconductor zones are the second edge zone 22 between the two edge trenches 25 and further edge zone 26.

The transistor cell array of the component according to FIG. 3 is modified as compared to the transistor cell array of the component according to FIG. 1. Transistor cells of the cell array of FIG. 3 differ from the transistor cells of FIG. 1 in that the field electrodes 17 in a vertical direction extend up to a level of the body zones 12, but are surrounded by the gate electrode 16 within the trenches. This particular form of the field electrodes 17 and the gate electrodes 15 is the result of a manufacturing process, in which first field dielectric layer 18 and than the field electrodes 17 are produced. The field electrodes 17 and field dielectric layer 18 are then etched away in upper regions of the trenches prior to producing gate electrodes 15. It should be noted that the transistor structure according to FIG. 3 may have an edge structure according to FIG. 1 as well.

Referring to FIGS. 1 and 2 edge electrodes 23 may extend up to the front side 101 of semiconductor body 100. However, referring to FIG. 3 field electrodes 23 may either be disposed below front side 101 and may be covered by a dielectric layer disposed between the front side and the edge electrodes 23.

Figure 4:
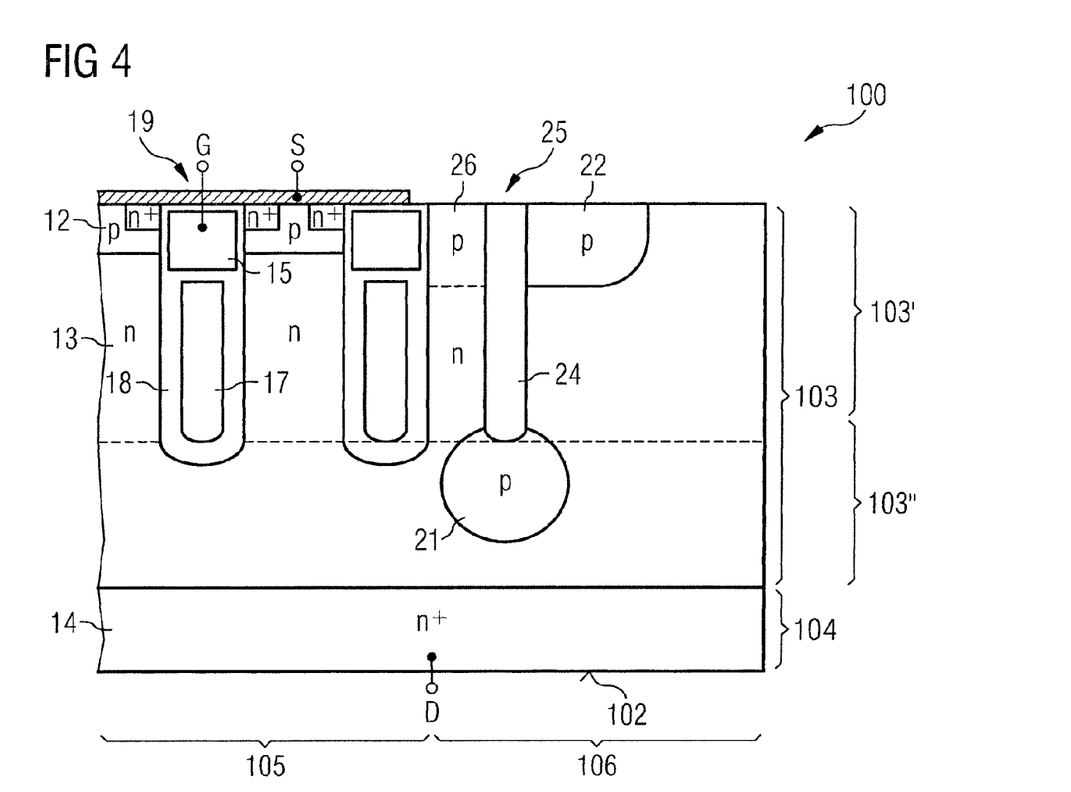
FIG. 4 illustrates a semiconductor component realized as a MOS transistor, with the component having an edge structure including a trench filled with a dielectric.

FIG. 4 illustrates a semiconductor component which is modified as compared to the semiconductor component of FIG. 1. The semiconductor component of FIG. 4 includes an edge structure in edge region 106, with the edge structure having a trench 25 being completely filled with an edge dielectric layer 24. The edge structure further includes a first edge zone 22, being doped complementary to the basic doping of semiconductor layer 103, directly adjoining the trench 25, and in a vertical direction of the semiconductor body 100 being disposed at least partially below trench 25. A doping concentration of the first edge zone 21 is selected such, that the edge zone 21 is depleted completely, when the component blocks, or is depleted except for an area having dimensions smaller than a width of trench 25 in a lateral direction. When the component blocks all dopants or at least a bigger part of dopants in the edge zone 21 are ionized.

The edge structure according to FIG. 4 includes an optional second edge zone 22, with the second edge zone 22 adjoining the trench 25 in a lateral direction opposite to the direction of the inner region 105, and adjoining the front side 101 in a vertical direction. Second edge zone 22 in the vertical direction extends deeper into the semiconductor body as compared to active component zone 12—the body zone in the example. Further, the component includes an optional further edge zone 26, with the further edge zone 26 being doped complementary to the basic doping of semiconductor layer 103, being disposed between edge trench 25 and the outermost trench of the transistor structure, and extending from the edge trench 25 to the transistor trench. A doping charge or doping concentration of second edge zone 22 may be selected such, that second edge zone 22 may not be completely depleted.

Corresponding to the embodiments of FIGS. 1 to 3 the semiconductor components of FIGS. 4 and 5 (which will be explained below) may include two differently doped partial layers. A higher doped partial layer 103' is present in an upper region of semiconductor body 100, in which the trenches 19 with the gate electrodes 15 and the field electrodes 17 are disposed, and a lower doped layer 103" is disposed between higher doped layer 103' and substrate 104, with the substrate forming a drain zone 14 in the example. Trench 25 (FIG. 4) and trenches 25 (FIG. 5) with the dielectric 24 may extend through higher doped partial layer 103' into the lower doped layer 103". A bigger part of edge zone 21 is disposed in the lower doped partial layer 103".

Figure 5:
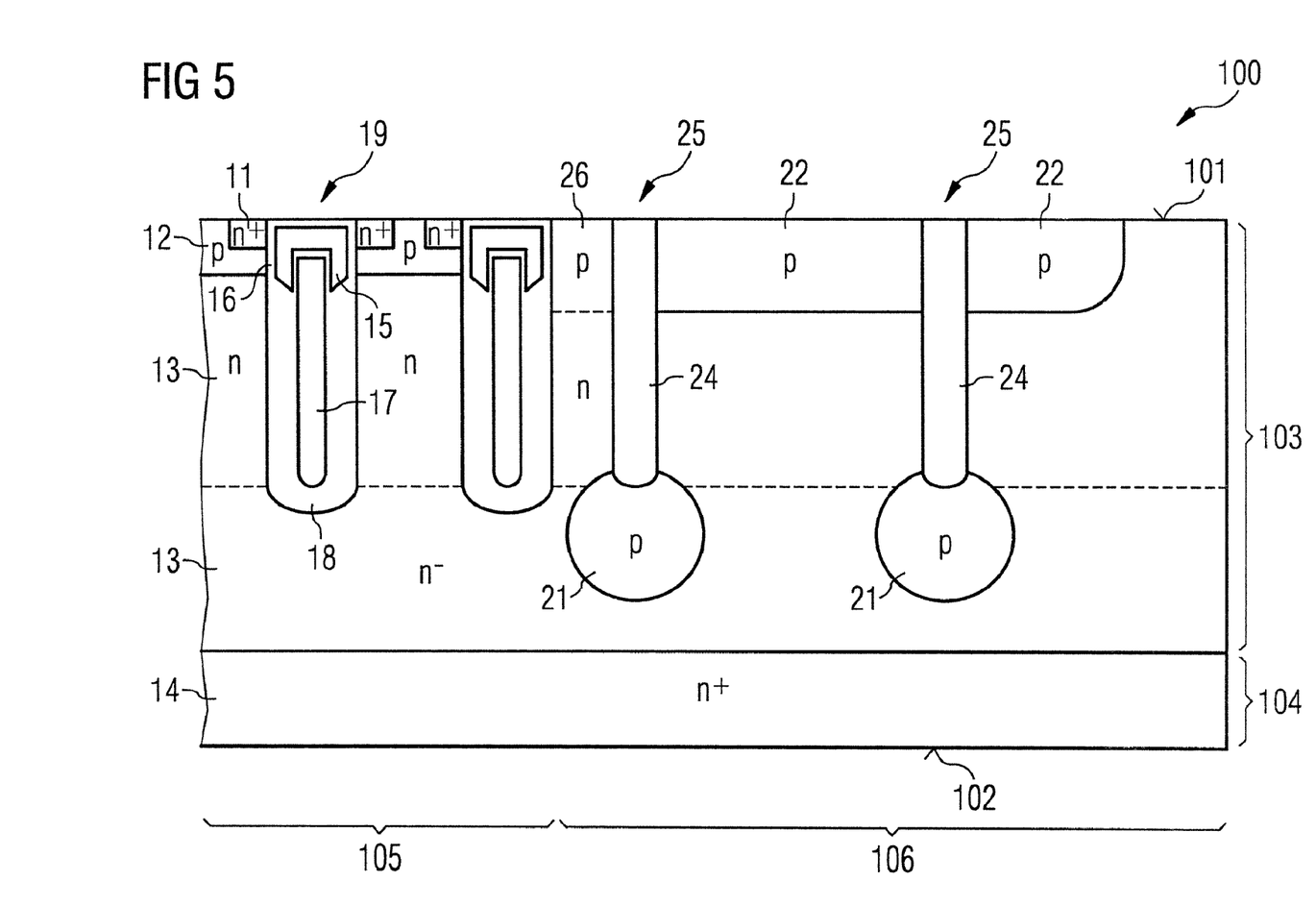
FIG. 5 illustrates a semiconductor component realized as a MOS transistor, with the component including an edge structure with several trenches, with each of the trenches being filled with a dielectric.

FIG. 5 illustrates an edge structure which is modified as compared to the edge structure according to FIG. 4. The edge structure of FIG. 5 includes several—two in the example—edge trenches 25, being completely filled with edge dielectric layers 24. Associated with each of these edge trenches 25 is a first edge zone 21, with the first edge zones 21 being at least partially disposed below the trenches 25, and having a doping charge or doping concentration selected such that they may be depleted completely or except for a region having dimensions smaller than a width of the trench. Optional second edge zones 22 may further be associated with each of these trenches, with the second edge zones 22 adjoining the trenches in a lateral direction and adjoining the front side 101 in a vertical direction.

The edge structures explained with reference to FIGS. 1 to 5 are—in particular—suitable for semiconductor components including a semiconductor layer 103 having two differently doped partial layers: a first partial layer 103', adjoining the active component zone 12, and a second partial layer 103", adjoining the first partial layer 103' and being lower doped than the first partial layer 103'. Referring to FIGS. 1 to 5, in which a sub-division of semiconductor layer 103 in two partial layers is depicted in dashed lines, the lower doped partial layer 103" is basically disposed below the edge structure. Lower doped partial layer 103" serves to increase the voltage proof of the component. The edge structure may be disposed in the higher doped first partial layer 103'.

Figure 6A:
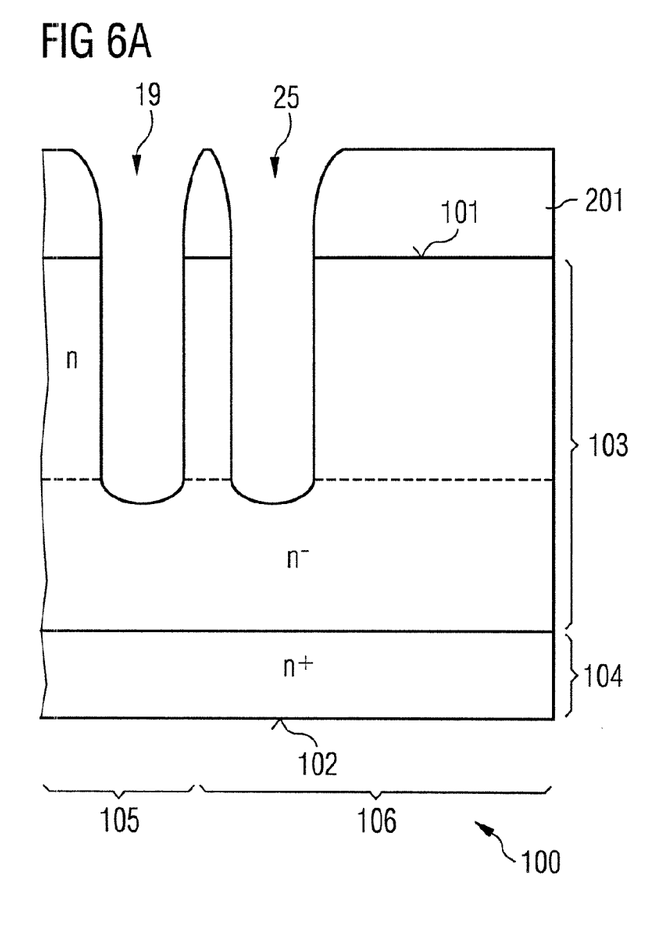
FIG. 6 illustrates process steps for producing an edge structure according to FIGS. 1 and 2.

A possible method for producing the edge structures of FIGS. 1 to 3 will be explained with reference to FIG. 6 in the following. FIG. 6A illustrates a cross section through the semiconductor body 100 after first processes, in which trenches are etched into the semiconductor body 100 via the front side 101 using an etch mask 201 disposed on the front side. Trench etching is performed in the inner region 105 for producing the trenches that serve to accommodate the gate electrodes of the transistor structure, and in the edge region 106 for producing at least one trench accommodating edge electrode 23. Reference character 19 in FIG. 6A denotes a trench of inner region 105, and reference character 25 a trench of edge region 106.

Figure 6B:
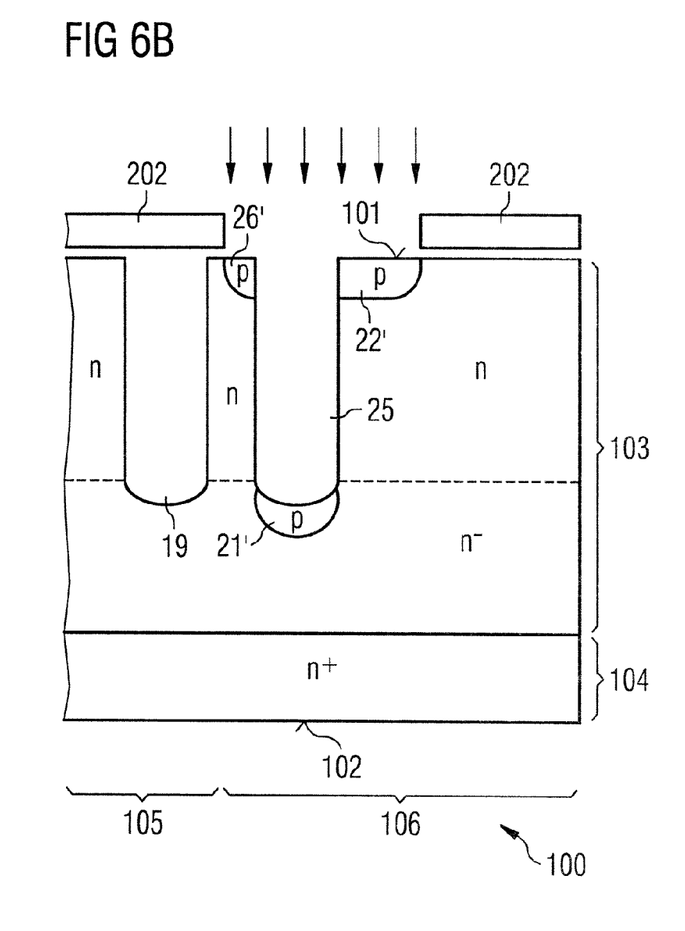

FIG. 6B illustrates the method during further processes, in which using a further mask 202 dopants are implanted into semiconductor body 100. Mask 202, which, for example, is a diaphragm/face plate and disposed above the front side 101, is selected such, that dopants are implanted into semiconductor layer 103 via the ground of edge trench 25, and that dopants via the front side 101 are implanted in areas of semiconductor layer 103 adjoining the trench 25 in lateral direction.

Mask 202 that is used for masking the semiconductor body 100 during the implantation process may be disposed distant to the front side 101 of the semiconductor body. Further, a scattering layer (not illustrated) may be disposed on the front side 101 of the semiconductor body 100 and on uncovered surfaces of the trenches. Dopants are then implanted through the scattering layer into semiconductor body 100. Given an implantation energy scattering layer effects a variation of implantation depths. Diaphragm/mask in this method may be disposed distant to the scattering layer or may directly adjoin the scattering layer.

Implanted regions resulting from the implantation are denoted with reference characters 21', 22' in FIG. 6B. These implanted regions 21', 22' are the basis for the first and second edge zones 21, 22. Mask 202 is selected such, that an implantation of dopants into the trenches 19 of inner region 105 is prevented. However, mask 202 may be selected such, that dopants are implanted into the semiconductor region between the edge trench 25 and the outermost transistor trench 19, for forming a further implanted zone 26'. Further implanted zone 26' is the basis for further edge zone 26. Following the implantation an annealing process may be performed for annealing crystal defects resulting from the implantation, and for electrically activating implanted dopants. The temperature of the annealing process is, for example, in the range between 1000° C. and 1200° C., in particular between 1050° C. and 1100° C.

Figure 6C:
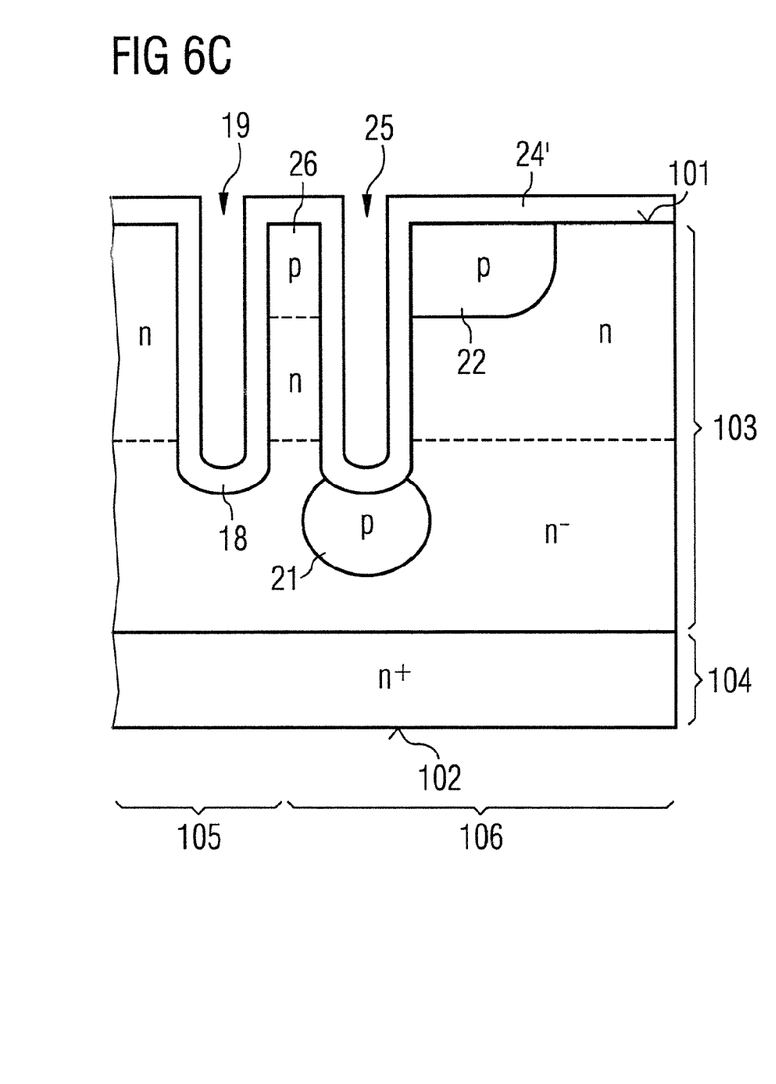

FIG. 6C illustrates the semiconductor body 100 after further processes, in which—after removing mask 202—a dielectric layer 24' is deposited on the complete semiconductor surface, i.e. on the front side 101 as well as in the trenches 19, 25. The dielectric layer is, for example, a thermal semiconductor oxide produced by an oxidation process, or a deposited oxide. Dielectric layer 24' in trench 19 of the inner region 105 forms the later field electrode dielectric and in edge trench 25 forms the later edge dielectric. During the process of producing dielectric layer 24' temperature processes are required, which make the previously implanted dopants diffuse deeper into the semiconductor body 100. Edge zones 21, 22, 26 of edge structure result from this diffusion process. It should be noted, that during further processes for producing or finishing the semiconductor component further temperature processes may be required, which result for the previously implanted dopants to diffuse even deeper into the semiconductor body.

Figure 6D:
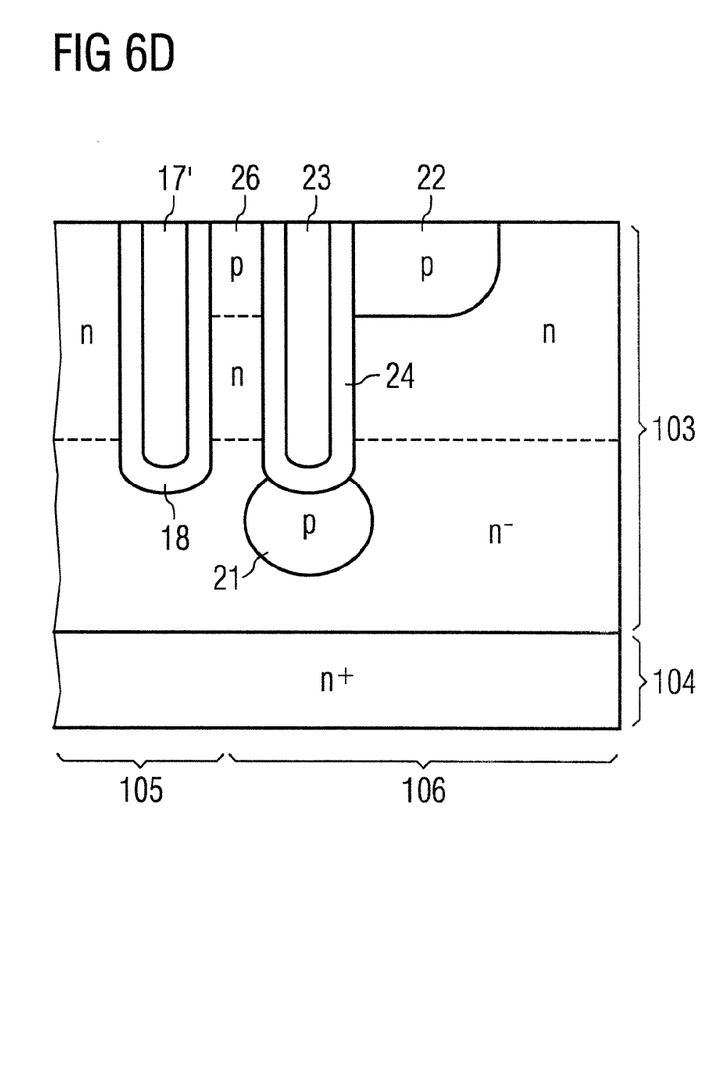

FIG. 6D illustrates the semiconductor body after further processes, in which the trenches 19, 25 are filled with an electrode material for forming edge electrode 23 in the edge trench, and for forming a precursor of later field electrode 17 in the inner region 105.

Following these processes further processes are performed for producing the transistor structure in inner region 105 of the semiconductor body, with these processes are not illustrated in the figures. Edge region 106 of semiconductor body 100 is masked during these processes.

A process of manufacturing the edge structure according to FIGS. 4 and 5 having trenches being completely filled with dielectric 24 is different from the method according to FIGS. 6A to 6C in that an opening of mask 201 for producing the edge trench 25 is smaller than openings of the mask 201 for producing the transistor trenches 19. When depositing the dielectric layer (24' in FIG. 6C) edge trench 25 is completely filled with dielectric material, while a space remains in the transistor trench 19, with the space being later filled with an electrode material. During the etch process the smaller width of edge trench 25 as compared to the width of transistor trench 19 results to a smaller vertical dimension of edge trench 25 as compared to transistor trench 19. This is illustrated in FIGS. 4 and 5. In the components of FIGS. 4 and 5 a smaller width of edge trenches 25 as compared to trenches 19 of the cell array is required, if dielectric 24 of edge trenches 25 is to be produced by the same processes as field plate dielectric 18. Producing the dielectric is performed by either growing an oxide layer or by depositing a dielectric layer, where in both cases edge trench 25 is to be filled completely, while trench 19 of the cell array is to be filled not completely.

In edge structures having an edge electrode 23 and an edge dielectric 24 disposed in a trench, as well as in edge structures having a trench being completely filled with a dielectric, edge trench 25 may be realized such, that edge trench 25 extends deeper into the semiconductor body 100 as compared to the trenches of the cell array (not illustrated). In an edge structure having several edge trenches at least the edge trench being disposed closest to the cell array extends deeper into the semiconductor body.

Producing an edge trench extending deeper into the semiconductor body as compared to trenches of the cell array may be performed simultaneously with producing the trenches of the cell array. In this connection an etch mask for etching the trenches is selected such, that the edge trench in a lateral direction of the semiconductor body 100 is wider than the trenches of the cell array. During a given duration of the etching process an edge trench is formed that is deeper as compared to trenches of the cell array. To completely fill a wider, and therefore deeper, edge trench with a dielectric layer in order to obtain an edge structure according to FIGS. 4 and 5, two processes may become necessary: in a first process, which produces the field plate dielectric 18 in the trenches 19 of the cell array, the edge trench is partially filled with a dielectric; in a second process the edge trenches are completely filled with a dielectric, for example by separately depositing a dielectric in the edge region.

It should be noted, that the edge structures explained before are not restricted to be used in MOS transistors, diodes or Schottky diodes, but may be used in any vertical power semiconductor component, in particular bipolar transistors. A bipolar transistor is basically different from the explained MOS transistors in that it does not include a gate electrode. Source zone, body zone and drain zone of a MOS transistor correspond to emitter zone, basis zone and collector zone of a bipolar transistor. A bipolar transistor is controlled via its basis zone.

It should be further noted, that the explained edge structure may also be used in components without compensation structure, i.e. without field electrode.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
    a semiconductor body comprising a first side, a second side, an inner region, an edge region adjoining the inner region in a lateral direction of the semiconductor body, and a first semiconductor layer extending across the inner region and the edge region and having a basic doping of a first conductivity type;
    at least one active component zone of a second conductivity type, which is complementary to the first conductivity type, being disposed in the inner region in the first semiconductor layer; and
    an edge structure disposed in the edge region and comprising at least one trench extending from the first side into the semiconductor body, an edge electrode disposed in the trench, a dielectric layer disposed in the trench between the edge electrode and the semiconductor body, a first edge zone of the second conductivity type adjoining the trench and being at least partially disposed below the trench,
    wherein the edge electrode is electrically coupled to a semiconductor zone, the semiconductor zone being doped complementarily to a basic doping of the semiconductor layer and being disposed between the edge trench and the inner region, and
    wherein the edge electrode disposed in the trench is ring-shaped and surrounds a transistor structure of the inner region.

2. The semiconductor component of claim 1, comprising a second edge zone being separated from the first edge zone and laterally adjoining the at least one trench and adjoining the first side.

3. The semiconductor component of claim 1, being formed as a MOS transistor and comprising in the inner region of the semiconductor body:
    a source zone of a first conductivity type, a drift zone of the first conductivity type, and a body zone of the second conductivity type being disposed between the source zone and the drift zone; and
    at least one gate electrode being disposed adjacent to the body zone and being insulated against the body zone by a gate dielectric.

4. The semiconductor component of claim 3, wherein the at least one gate electrode is disposed in a trench, which starting from the first side extends into the semiconductor body.

5. The semiconductor component of claim 4, wherein a field electrode is disposed in the trench of the gate electrode, with the field electrode extending deeper into the semiconductor body than the gate electrode.

6. The semiconductor component of claim 1, wherein the edge electrode is electrically coupled to a source zone.

7. The semiconductor component of claim 1, in which the semiconductor zone that is doped complementary to the basic doping adjoins the edge trench.

8. The semiconductor component of claim 1, further comprising:
    at least two trenches with edge electrodes, with the trenches being disposed distant to each other in a lateral direction of the semiconductor body; and
    a number of first edge zones corresponding to the number of trenches.

9. The semiconductor component of claim 8, comprising a number of second edge zones corresponding to the number of trenches, with each of the second edge zones adjoining one edge trench in a direction opposite to the direction of the inner region.

10. The semiconductor component of claim 9, in which each of the second edge zones are disposed between two trenches and extend in a lateral direction from trench to trench.

11. A semiconductor component comprising:
    a semiconductor body comprising a first side, a second side, an inner region, an edge region adjoining the inner region in a lateral direction of the semiconductor body, and a first semiconductor layer extending across the inner region and the edge region and having a basic doping of a first conductivity type;
    at least one active component zone of a second conductivity type, which is complementary to the first conductivity type, being disposed in the inner region in the first semiconductor layer; and
    an edge structure disposed in the edge region and comprising at least one trench extending from the first side into the semiconductor body, an edge electrode disposed in the trench, a dielectric layer disposed in the trench between the edge electrode and the semiconductor body, a first edge zone of the second conductivity type adjoining the trench and being at least partially disposed below the trench, wherein the first edge zone has a doping concentration such that the first edge zone is completely depleted when applying a blocking voltage to the component,
    wherein the edge electrode is electrically coupled to a semiconductor zone, the semiconductor zone being doped complementarily to a basic doping of the semiconductor layer and being disposed between the edge trench and the inner region, and
    wherein the edge electrode disposed in the trench is ring-shaped and surrounds a transistor structure of the inner region.

* * * * *